(12) United States Patent
Amirkhany et al.

(10) Patent No.: US 11,069,282 B2
(45) Date of Patent: Jul. 20, 2021

(54) CORRELATED DOUBLE SAMPLING PIXEL SENSING FRONT END

(71) Applicant: Samsung Display Co., Ltd., Yongin-si (KR)

(72) Inventors: Amir Amirkhany, Sunnyvale, CA (US); Anup P. Jose, San Jose, CA (US); Gaurav Malhotra, Cupertino, CA (US); Younghoon Song, Santa Clara, CA (US); Mohamed Elzeftawi, San Jose, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 166 days.

(21) Appl. No.: 16/656,423

(22) Filed: Oct. 17, 2019

(65) Prior Publication Data

US 2021/0049951 A1 Feb. 18, 2021

Related U.S. Application Data

(60) Provisional application No. 62/887,434, filed on Aug. 15, 2019.

(51) Int. Cl.
*G09G 3/32* (2016.01)
*G01R 17/02* (2006.01)
*H03F 3/45* (2006.01)

(52) U.S. Cl.
CPC ............. *G09G 3/32* (2013.01); *G01R 17/02* (2013.01); *G09G 2320/043* (2013.01); *H03F 3/45977* (2013.01)

(58) Field of Classification Search
None
See application file for complete search history.

(56) References Cited

U.S. PATENT DOCUMENTS

| 5,239,210 A | 8/1993 | Scott |
| 6,753,913 B1 | 6/2004 | Bilhan et al. |

(Continued)

FOREIGN PATENT DOCUMENTS

| EP | 0 986 900 B1 | 8/2005 |
| EP | 2 738 757 A1 | 6/2014 |

(Continued)

OTHER PUBLICATIONS

U.S. Office Action dated Aug. 7, 2020, issued in U.S. Appl. No. 16/656,447 (26 pages).

(Continued)

*Primary Examiner* — Krishna P Neupane
(74) *Attorney, Agent, or Firm* — Lewis Roca Rothgerber Christie LLP

(57) ABSTRACT

A system and method for operating a sensing circuit for sensing a pixel current of a pixel of a display panel using correlated double sampling. In some embodiments, the method includes: during a first interval of time, resetting a pixel sensing circuit; during a third interval of time following the first interval of time, operating the pixel sensing circuit in an integration mode; during a fourth interval of time following the third interval of time, operating the pixel sensing circuit in a hold mode; and during a fifth interval of time following the fourth interval of time, operating the pixel sensing circuit in the integration mode.

20 Claims, 11 Drawing Sheets

(56) References Cited

U.S. PATENT DOCUMENTS

| | | | |
|---|---|---|---|
| 6,822,679 B1 | 11/2004 | Kulhalli et al. | |
| 6,909,391 B2 | 6/2005 | Rossi | |
| 6,919,551 B2 | 7/2005 | Barna et al. | |
| 7,245,321 B2 | 7/2007 | Panicacci et al. | |
| 7,764,118 B2 | 7/2010 | Kusuda et al. | |
| 8,497,731 B1* | 7/2013 | Beckwith | H03H 19/00 327/558 |
| 8,659,325 B2 | 2/2014 | Nishi | |
| 9,191,598 B2 | 11/2015 | Blanquart et al. | |
| 9,721,504 B2 | 8/2017 | Kim et al. | |
| 9,722,582 B2 | 8/2017 | Jung | |
| 10,714,051 B1 | 7/2020 | Huang et al. | |
| 10,762,836 B1 | 9/2020 | Bae et al. | |
| 2005/0243193 A1 | 11/2005 | Gove et al. | |
| 2005/0248671 A1 | 11/2005 | Schweng | |
| 2006/0139097 A1 | 6/2006 | Mukherjee et al. | |
| 2006/0238477 A1 | 10/2006 | Lew et al. | |
| 2007/0030262 A1 | 2/2007 | Ambo et al. | |
| 2007/0080908 A1 | 4/2007 | Nathan et al. | |
| 2009/0058324 A1 | 3/2009 | Nakao | |
| 2009/0237121 A1* | 9/2009 | Surendranath | G11C 27/026 327/96 |
| 2010/0271517 A1 | 10/2010 | De Wit et al. | |
| 2013/0082936 A1 | 4/2013 | Islamkulov et al. | |
| 2013/0099692 A1 | 4/2013 | Chaji et al. | |
| 2013/0100173 A1 | 4/2013 | Chaji et al. | |
| 2013/0141368 A1 | 6/2013 | Wang et al. | |
| 2014/0152642 A1 | 6/2014 | Kim et al. | |
| 2014/0198092 A1 | 7/2014 | Azizi et al. | |
| 2015/0009204 A1* | 1/2015 | Chaji | G09G 3/3233 345/214 |
| 2015/0195569 A1 | 7/2015 | Jung et al. | |
| 2015/0213757 A1 | 7/2015 | Takahama et al. | |
| 2015/0243221 A1 | 8/2015 | Lim | |
| 2015/0261341 A1 | 9/2015 | Weinerth et al. | |
| 2016/0005358 A1 | 1/2016 | Wang | |
| 2016/0012765 A1 | 1/2016 | Jeong | |
| 2016/0055791 A1 | 2/2016 | Kishi et al. | |
| 2016/0202061 A1 | 7/2016 | Maurer et al. | |
| 2016/0261817 A1 | 9/2016 | Totsuka et al. | |
| 2016/0267844 A1 | 9/2016 | Senda et al. | |
| 2016/0372044 A1 | 12/2016 | Kwon et al. | |
| 2017/0003779 A1 | 1/2017 | Reynolds et al. | |
| 2017/0039939 A1 | 2/2017 | Chaji | |
| 2017/0039953 A1 | 2/2017 | Lee | |
| 2017/0090669 A1 | 3/2017 | Paladugu et al. | |
| 2017/0154573 A1* | 6/2017 | Woo | G09G 3/3291 |
| 2018/0100943 A1 | 4/2018 | Sternberg | |
| 2018/0114815 A1* | 4/2018 | Lee | G09G 3/3291 |
| 2018/0182303 A1 | 6/2018 | Jung et al. | |
| 2018/0336816 A1 | 11/2018 | Shin et al. | |
| 2019/0035351 A1 | 1/2019 | Pyun et al. | |
| 2019/0088205 A1 | 3/2019 | Zhang et al. | |
| 2019/0221146 A1 | 7/2019 | Lin et al. | |
| 2019/0247664 A1 | 8/2019 | Irazoqui et al. | |
| 2019/0336757 A1 | 11/2019 | Rodriguez et al. | |
| 2020/0091884 A1 | 3/2020 | Venkatraman et al. | |
| 2020/0184888 A1 | 6/2020 | Brownlow et al. | |
| 2020/0202787 A1* | 6/2020 | Do | G09G 3/2007 |

FOREIGN PATENT DOCUMENTS

| | | |
|---|---|---|
| EP | 3 343 556 A1 | 7/2018 |
| KR | 10-2008-0107064 A | 12/2008 |
| KR | 10-2013-0053458 A | 5/2013 |

OTHER PUBLICATIONS

U.S. Office Action dated Nov. 5, 2020, issued in U.S. Appl. No. 16/848,706 (22 pages).

Chen,Hsin-Liang, et al.; A Low-Offset Low-Noise Sigma-Delta Modulator With Pseudorandom Chopper-Stabilization Technique, IEEE Transactions on Circuits and Systems—I: Regular Papers, vol. 56, No. 12, Dec. 2009, 11 pages.

Extended European Search Report for corresponding European Patent Application No. 20179974.9, dated Aug. 20, 2020, 12 pages.

Extended European Search Report for corresponding European Patent Application No. 20176949.4, dated Aug. 27, 2020, 13 pages.

U.S. Office Action dated Jan. 28, 2021, issued in U.S. Appl. No. 16/869,546 (10 pages).

U.S. Appl. No. 16/656,423, filed Nov. 6, 2019.

U.S. Appl. No. 16/656,447, filed Oct. 17, 2019.

U.S. Appl. No. 16/657,680, filed Oct. 18, 2019.

U.S. Notice of Allowance dated Sep. 9, 2020, issued in U.S. Appl. No. 16/657,680 (8 pages).

Extended European Search Report for corresponding European Patent Application No. 20156633.8, dated Apr. 16, 2020, 9 pages.

U.S. Notice of Allowance dated Dec. 11, 2020, issued in U.S. Appl. No. 16/656,447 (10 pages).

* cited by examiner

| Mode | T1 | T2 | T3 | T4 |
|---|---|---|---|---|
| 515 Reset | Closed | Closed | Closed[1] | Normal[1] |
| 520 Wait | Open | Closed | Closed[1] | Normal[1] |
| 525 Sense $I_n$ | Open | Open | Closed | Normal |
| 530 Hold | Open | Open | Open | Switch[2] |
| 535 Sense $I_{sense}$ | Open | Open | Closed | Switch |

*FIG. 5D*

CORRELATED DOUBLE SAMPLING PIXEL SENSING FRONT END

CROSS-REFERENCE TO RELATED APPLICATION(S)

The present application claims priority to and the benefit of U.S. Provisional Application No. 62/887,434, filed Aug. 15, 2019, entitled "CORRELATED DOUBLE SAMPLING PIXEL SENSING FRONT-END", the entire content of which is incorporated herein by reference.

FIELD

One or more aspects of embodiments according to the present disclosure relate to displays, and more particularly to measuring pixel characteristics.

BACKGROUND

A video display such as those used for computers or mobile devices may have a plurality of pixels, and, in each pixel, a plurality of transistors, including a drive transistor configured to control a drive current through a display element such as a light emitting diode (LED) (e.g., an organic light emitting diode (OLED)). Variations between the characteristics of the drive transistors of the display, or changes with time of the characteristics of any one of the drive transistors may, if not compensated for, degrade the quality of images or video displayed by the display. To compensate for such variation, or changes, it may be advantageous to measure the characteristics of the drive transistors.

Thus, there is a need for a system and method for measuring characteristics of drive transistors in a display.

SUMMARY

According to an embodiment of the present invention, there is provided a system for sensing a current of a pixel in a display, the system including: a differential low-pass filter having a differential input and a differential output, a first conductor of the differential input being configured to receive a difference between a pixel current and a reference current; a differential integrator having a differential input and a differential output; two mirroring capacitors coupling the differential output of the differential low-pass filter to the differential input of the differential integrator; a polarity-reversing switch coupled between the mirroring capacitors and the differential input of the differential integrator, the polarity-reversing switch being configured to selectively switch the polarity of the connection between the mirroring capacitors and the differential input of the differential integrator; and a pair of coupling switches coupled between the two mirroring capacitors and the polarity-reversing switch, each of the coupling switches being configured to selectively: disconnect a terminal of a respective mirroring capacitor of the two mirroring capacitors from a corresponding terminal of the polarity-reversing switch and connect the terminal of the respective mirroring capacitor to a supply node.

In some embodiments, the differential low-pass filter includes: a differential amplifier; two feedback capacitors, each connected between a respective conductor of the differential output of the differential low-pass filter and a corresponding conductor of the differential input of the differential low-pass filter; and two reset switches, each connected across a respective feedback capacitor of the two feedback capacitors and configured to selectively discharge the respective feedback capacitor.

In some embodiments, the differential amplifier is a fully differential amplifier.

In some embodiments, the differential amplifier is a pseudo differential amplifier.

In some embodiments, the differential integrator includes: a fully differential amplifier; two feedback capacitors, each connected between a respective conductor of the differential output of the differential integrator and a corresponding conductor of the differential input of the differential integrator; and two reset switches, each connected across a respective feedback capacitor of the two feedback capacitors and configured to selectively discharge the respective feedback capacitor.

In some embodiments, the system further includes: a display panel including a first pixel and a second pixel; and a control circuit, the control circuit being configured to: set a stored voltage of the first pixel to a first value, the first value corresponding to an on state of the first pixel; set a stored voltage of the second pixel to a second value, the first value corresponding to an off state of the second pixel; close the reset switches of the differential low-pass filter; close the reset switches of the differential integrator; disable a current output of the first pixel; open the reset switches of the differential low-pass filter; open the reset switches of the differential integrator; wait during a first integration interval; cause the polarity-reversing switch to reverse the polarity of the connection between the mirroring capacitors and the differential input of the differential integrator; and wait during a second integration interval.

In some embodiments, the control circuit is further configured to wait, after opening the reset switches of the differential low-pass filter and before opening the reset switches of the differential integrator, during an interval having a length at least twice a closed-loop time constant of the differential low-pass filter.

In some embodiments, the control circuit is further configured to: set the coupling switches to disconnect the two mirroring capacitors from the polarity-reversing switch at the end of the first integration interval; wait during a maximum stabilization time; and set the coupling switches to connect the two mirroring capacitors to the polarity-reversing switch at the beginning of the second integration interval, the maximum stabilization time begin the larger of: a time for the reference current to stabilize at the differential input of the differential low-pass filter, and a time for the pixel current to stabilize at the differential input of the differential low-pass filter.

According to an embodiment of the present invention, there is provided a method for operating a sensing circuit for sensing a pixel current of a pixel of a display panel, using correlated double sampling, the method including: during a first interval of time, resetting a pixel sensing circuit; during a third interval of time following the first interval of time, operating the pixel sensing circuit in an integration mode; during a fourth interval of time following the third interval of time, operating the pixel sensing circuit in a hold mode; and during a fifth interval of time following the fourth interval of time, operating the pixel sensing circuit in the integration mode, the pixel sensing circuit being configured to sense the pixel current, the pixel sensing circuit including a low-pass filter and an integrator connected to an output of the low-pass filter, the method further including maintaining the polarity of the connection between the integrator and the output of the low-pass filter reversed during the fourth interval of time and during the fifth interval of time, the resetting of the pixel sensing circuit including operating each of the low-pass filter and the integrator in a reset mode; the operating in the integration mode including: operating the low-pass filter in a normal mode and operating the integrator in the normal mode, and the operating in the hold mode including: operating the low-pass filter in the normal mode, operating the integrator in the normal mode, and disconnecting the integrator from the low-pass filter.

In some embodiments, the method further includes, during a second interval of time following the first interval of time and preceding the third interval of time, operating the pixel sensing circuit in a wait mode, the operating in the wait mode including: operating the low-pass filter in a normal mode and operating the integrator in the reset mode until a noise current of the pixel reaches a steady state.

In some embodiments, the low-pass filter is a differential low-pass filter and the integrator is a differential integrator.

In some embodiments, the differential low-pass filter includes: a differential amplifier; two feedback capacitors, each connected between a respective conductor of the differential output of the differential low-pass filter and a corresponding conductor of the differential input of the differential low-pass filter; and two reset switches, each connected across a respective feedback capacitor of the two feedback capacitors and configured to selectively discharge the respective feedback capacitor.

In some embodiments, the differential amplifier is a fully differential amplifier.

In some embodiments, the differential amplifier is a pseudo differential amplifier.

In some embodiments, the differential integrator includes: a differential amplifier; two feedback capacitors, each connected between a respective conductor of the differential output of the differential integrator and a corresponding conductor of the differential input of the differential integrator; and two reset switches, each connected across a respective feedback capacitor of the two feedback capacitors and configured to selectively discharge the respective feedback capacitor.

In some embodiments, the differential amplifier is a fully differential amplifier.

In some embodiments, the differential amplifier is a pseudo differential amplifier.

According to an embodiment of the present invention, there is provided a system for sensing a current of a pixel in a display, the system including: means for low-pass filtering having a differential input and a differential output, a first conductor of the differential input being configured to receive a difference between a pixel current and a reference current; a differential integrator having a differential input and a differential output; two mirroring capacitors coupling the differential output of the differential low-pass filter to the differential input of the differential integrator; a polarity-reversing switch coupled between the mirroring capacitors and the differential input of the differential integrator, the polarity-reversing switch being configured to selectively switch the polarity of the connection between the mirroring capacitors and the differential input of the differential integrator; and a pair of coupling switches coupled between the two mirroring capacitors and the polarity-reversing switch, each of the coupling switches being configured to selectively: disconnect a terminal of a respective mirroring capacitor of the two mirroring capacitors from a corresponding terminal of the polarity-reversing switch and connect the terminal of the respective mirroring capacitor to a supply node.

In some embodiments, the means for low-pass filtering includes: a differential amplifier; two feedback capacitors, each connected between a respective conductor of the differential output of the differential low-pass filter and a corresponding conductor of the differential input of the differential low-pass filter; and two reset switches, each connected across a respective feedback capacitor of the two feedback capacitors and configured to selectively discharge the respective feedback capacitor.

In some embodiments, the differential amplifier is a fully differential amplifier.

BRIEF DESCRIPTION OF THE DRAWINGS

These and other features and advantages of the present disclosure will be appreciated and understood with reference to the specification, claims, and appended drawings wherein:

FIG. 5D is a table of switch states, according to an embodiment of the present disclosure.

DETAILED DESCRIPTION

The detailed description set forth below in connection with the appended drawings is intended as a description of exemplary embodiments of a correlated double sampling pixel sensing front end provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1:
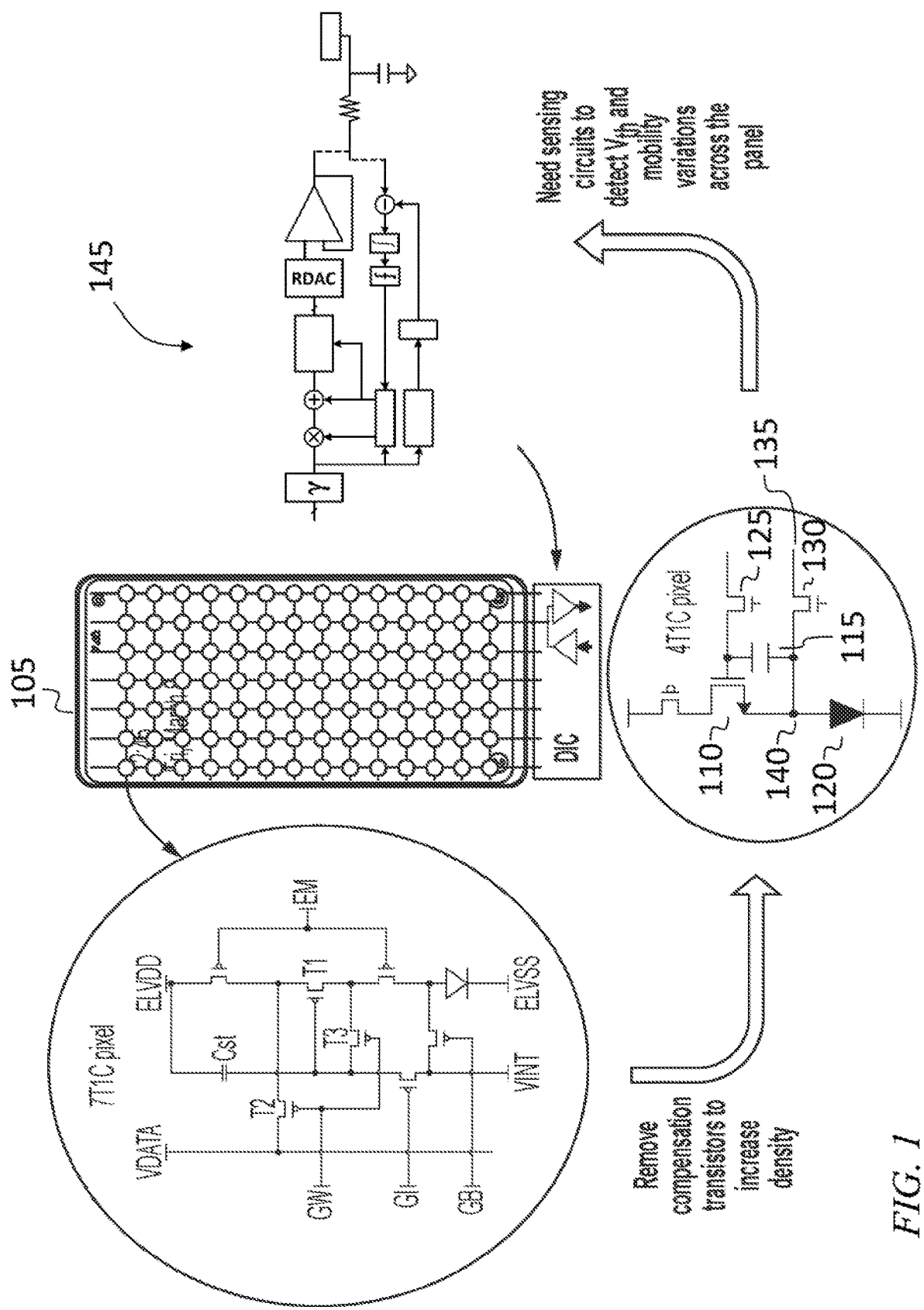
FIG. 1 is a context diagram, according to an embodiment of the present disclosure.

Referring to FIG. 1, in some embodiments a display (e.g., a mobile device display) 105 may include a plurality of pixels arranged in rows and columns. Each pixel may be configured to produce light of one color (e.g., red, green or blue) and may be part of a composite pixel that includes, e.g., three such pixels and that is configured to produce any of a wide range of colors (in some contexts, what is referred to herein as a "pixel" is instead referred to as a "sub-pixel", and what is referred to herein as a "composite pixel" is instead referred to as a "pixel"). Each pixel may include a drive circuit, e.g., 7-transistor 1-capacitor (7T1C) drive circuit as shown on the left of FIG. 1 or a 4-transistor 1-capacitor (4T1C) drive circuit as shown at the bottom of FIG. 1. In the 4T1C drive circuit, a drive transistor 110 (the gate-source voltage of which is controlled by the capacitor 115) controls the current through the light emitting diode 120 when the pixel is emitting light. An upper pass-gate transistor 125 may be used to selectively connect the gate of the drive transistor 110 (and one terminal of the capacitor 115) to a power supply voltage, and a lower pass-gate transistor 130 may be used to selectively connect a drive sense conductor 135 to a source node 140 (which is a node connected to the source of the drive transistor 110, to the anode of the light emitting diode 120 and to the other terminal of the capacitor 115).

A pixel drive and sense circuit 145 (discussed in further detail below) may be connected to the drive sense conductor 135. The pixel drive and sense circuit 145 may include a drive amplifier and a sensing circuit, configured to be selectively connected, one at a time, to the drive sense conductor 135. When current flows through the drive transistor 110, and the lower pass-gate transistor 130 is turned off, disconnecting the drive sense conductor 135 from the source node 140, current may flow through the light emitting diode 120, causing it to emit light. When the lower pass-gate transistor 130 is turned on and the drive sense conductor 135 is driven to a lower voltage than the cathode of the light emitting diode 120, the light emitting diode 120 may be reverse-biased and any current flowing in the drive sense conductor 135 may flow to the pixel drive and sense circuit 145, where it may be sensed. This sensed current may be compared to a desired current (e.g., the current that an ideal, or nominal transistor would drive at the same gate-source voltage), and to the extent that the sensed current differs from the ideal current, measures may be taken (e.g., the gate-source voltage may be adjusted) to compensate for the discrepancy.

Figure 2A:
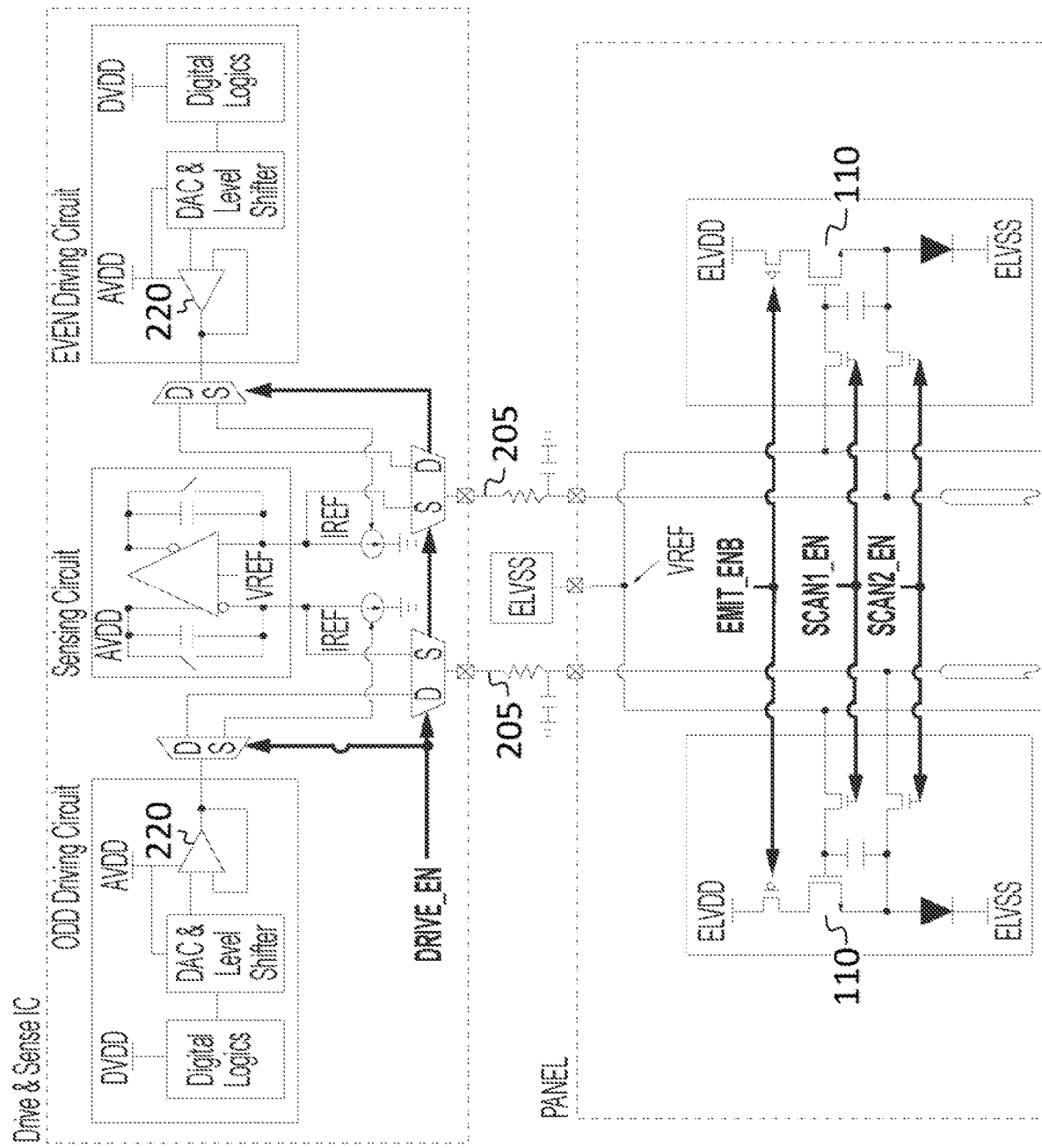
FIG. 2A is a schematic diagram of a display panel and a drive and sense integrated circuit, according to an embodiment of the present disclosure.

Referring to FIG. 2A, in some embodiments, the current of any pixel may be sensed in a differential manner, for improved accuracy. For example, if the current driven by the drive transistor 110 of the pixel on the left of FIG. 2A (which may be referred to as an "odd" pixel) is to be sensed, it may be turned on (by charging capacitor of the odd pixel so as to turn on the drive transistor 110 of the odd pixel), and the drive transistor 110 of the pixel on the right of FIG. 2A (which may be referred to as an "even" pixel) may be turned off (by discharging the capacitor of the even pixel so as to turn off the drive transistor 110 of the even pixel) and the difference between the two corresponding currents flowing out of two respective conductors, which may be referred to as "column conductors" 205, may be measured. Each of the column conductors 205 may be connected to all of the pixels of a column of the display; as a result, even if all of the pixels, other than the odd pixel being characterized, are turned off, the total leakage current in the other pixels may be significant. To the extent that the leakage currents in the adjacent column (containing the even pixel) are the same, the contribution of the leakage currents to the current flowing in the column conductor connected to the odd pixel may be canceled when the difference between the currents in the two column conductors 205 is sensed.

The SCAN1, SCAN2, and EMIT control lines may be per row, and may have different timing between rows. As mentioned above, differential sensing may be used, so that half the pixels in a row are sensed per operation. The same set of gate control signals may be applied to odd and even pixels, such that there is no distinction between odd and even pixels. Each digital to analog converter and associated drive amplifier 220 may be used both to drive a column conductor 205 to charge the capacitor of a pixel, and to generate the reference current when the current driven by the drive transistor 110 is being sensed; this may be accomplished using multiplexers, as shown. The embodiment of FIG. 1 does not include this feature and instead includes two separate digital to analog converters.

Figure 2B:
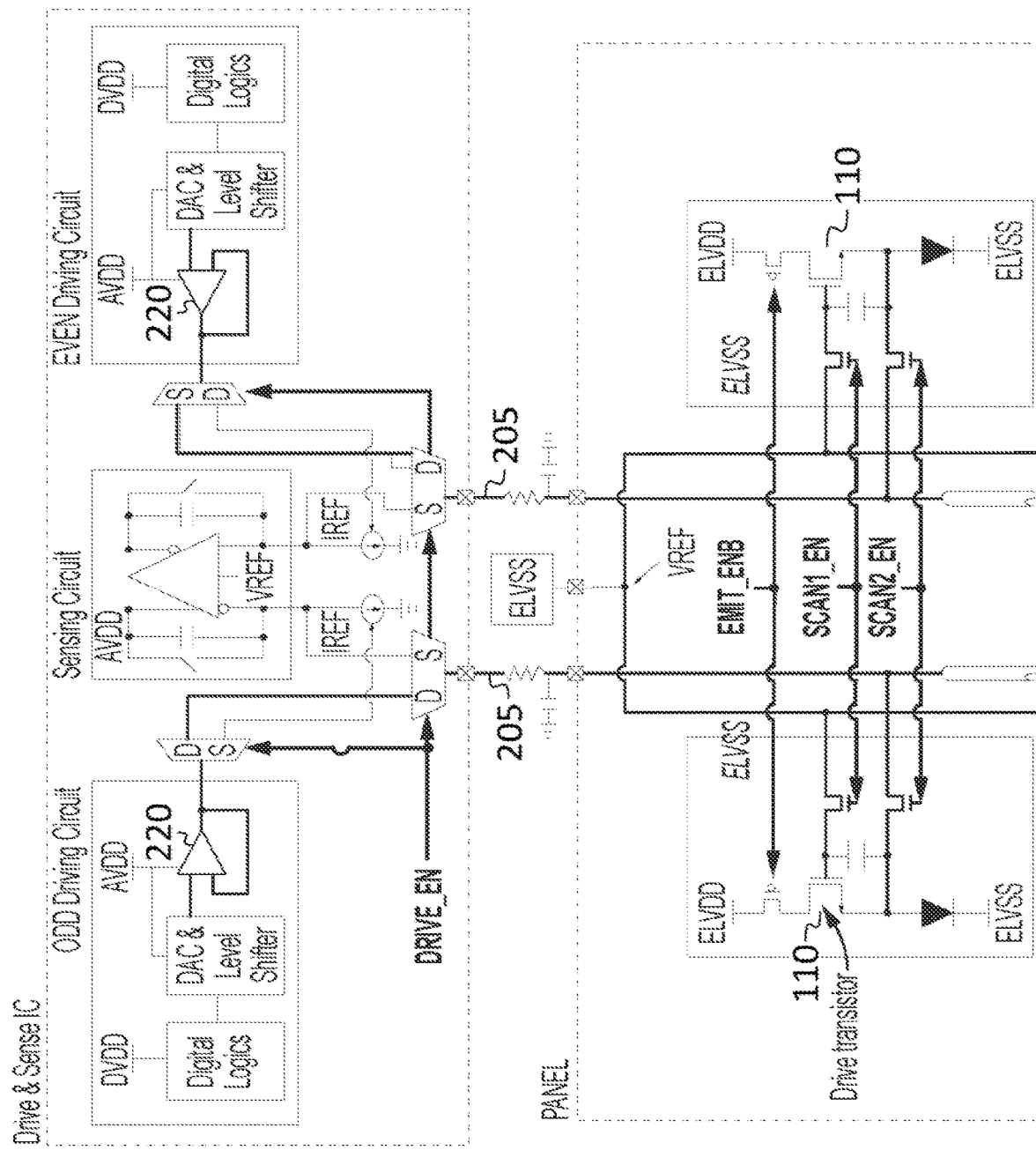
FIG. 2B is a schematic diagram of a display panel and a drive and sense integrated circuit, according to an embodiment of the present disclosure.

Referring to FIG. 2B, in some embodiments, when the circuit is in drive mode, the gate of the drive transistor 110 of each pixel is at ELVSS, and the source of the drive transistor 110 of each pixel is driven to ELVSS−VDRIVE, so that $$VGS=ELVSS-(ELVSS-VDRIVE)=VDRIVE.$$

The emit transistor of each pixel may remain turned off.

In this process, a respective VDRIVE may be stored across the pixel capacitor of each the pixels. When sensing the odd pixel, the VDRIVE used for the drive transistor 110 of the even pixel may be ELVSS, so that it will be turned off, as mentioned above.

Figure 2C:
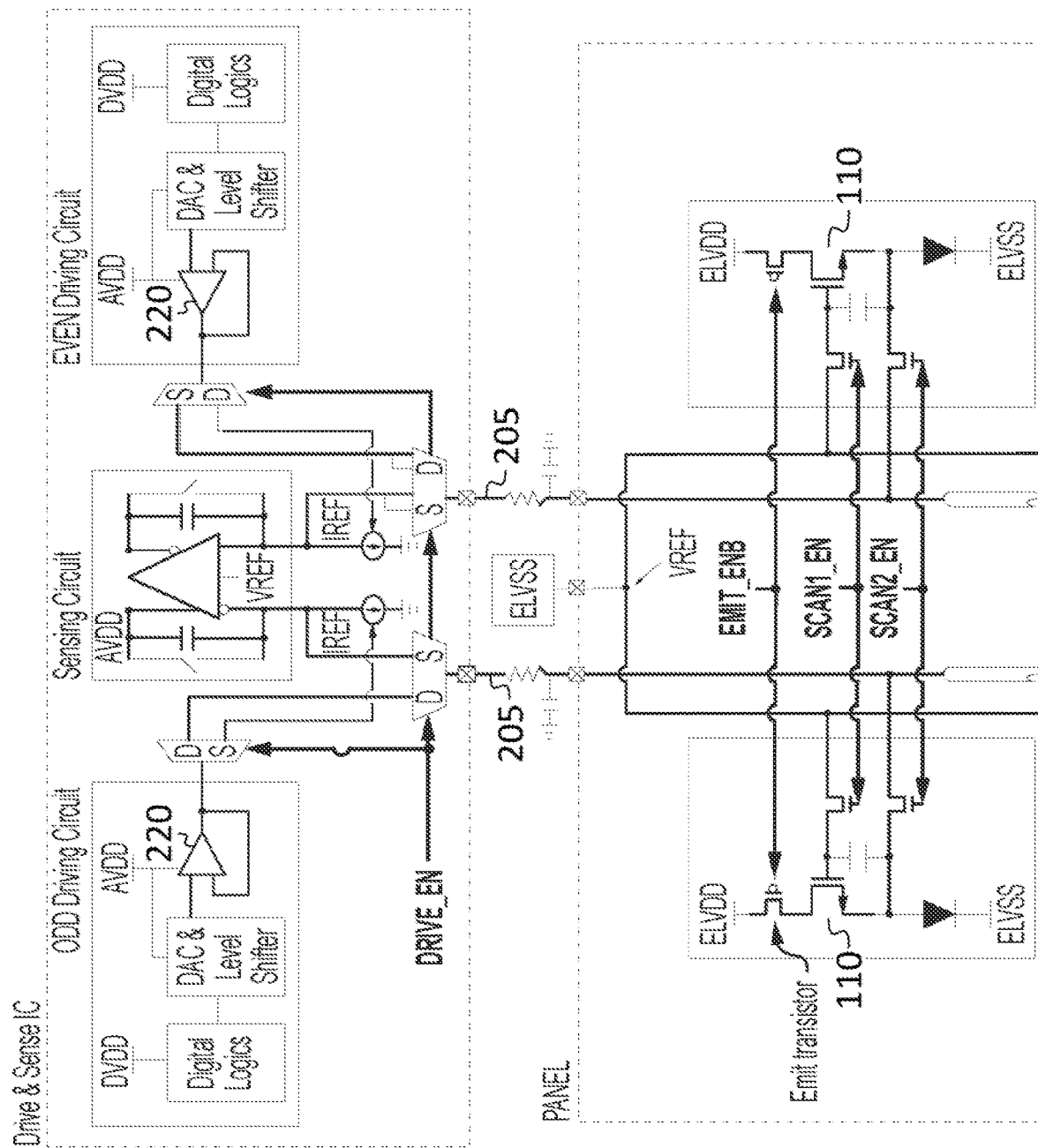
FIG. 2C is a schematic diagram of a display panel and a drive and sense integrated circuit, according to an embodiment of the present disclosure.

Referring to FIG. 2C, in some embodiments, when the circuit is in sense mode, the upper pass-gate transistors 125 (FIG. 1) are turned off so that the gates of the drive transistors 110 float, and so that the charge on the capacitor of each pixel remains constant. The source of the drive transistor 110 of each pixel is driven (e.g., to VREF, which may be slightly less than ELVSS) so that each light emitting diode 120 is reverse-biased, and so that no current flows through the light emitting diodes 120. The emit transistor of each pixel is turned on, and as a result of the light emitting diode 120 being reverse-biased, any current driven by the drive transistor 110 of a pixel flows through a respective column conductor 205 to the sensing circuit. In this mode, the digital to analog converter and the drive amplifier 220 connected to it may generate the reference current IREF. In some embodiments the reference current is generated by controlling the digital to analog converter and the drive amplifier 220 to produce a voltage ramp, which is applied to a capacitor to provide a current according to the following equation:

$$IREF=c\,dv/dt.$$

In operation, the front-end integrator may be reset prior to the sense operation. Each sense operation may be preceded by a drive operation during which the drive amplifier 220 (FIGS. 2A-2C) drives the column conductor 205 to a set voltage. Before a sense operation starts, the voltage on the column conductor may be restored to VREF. Another issue of concern with the circuit of FIG. 3C may be that because the capacitance to ground of the column conductor 205 may be large, the sense amplifier (in reset mode) may require a long time to bring the voltage of the column conductor 205 to VREF.

Figure 3:
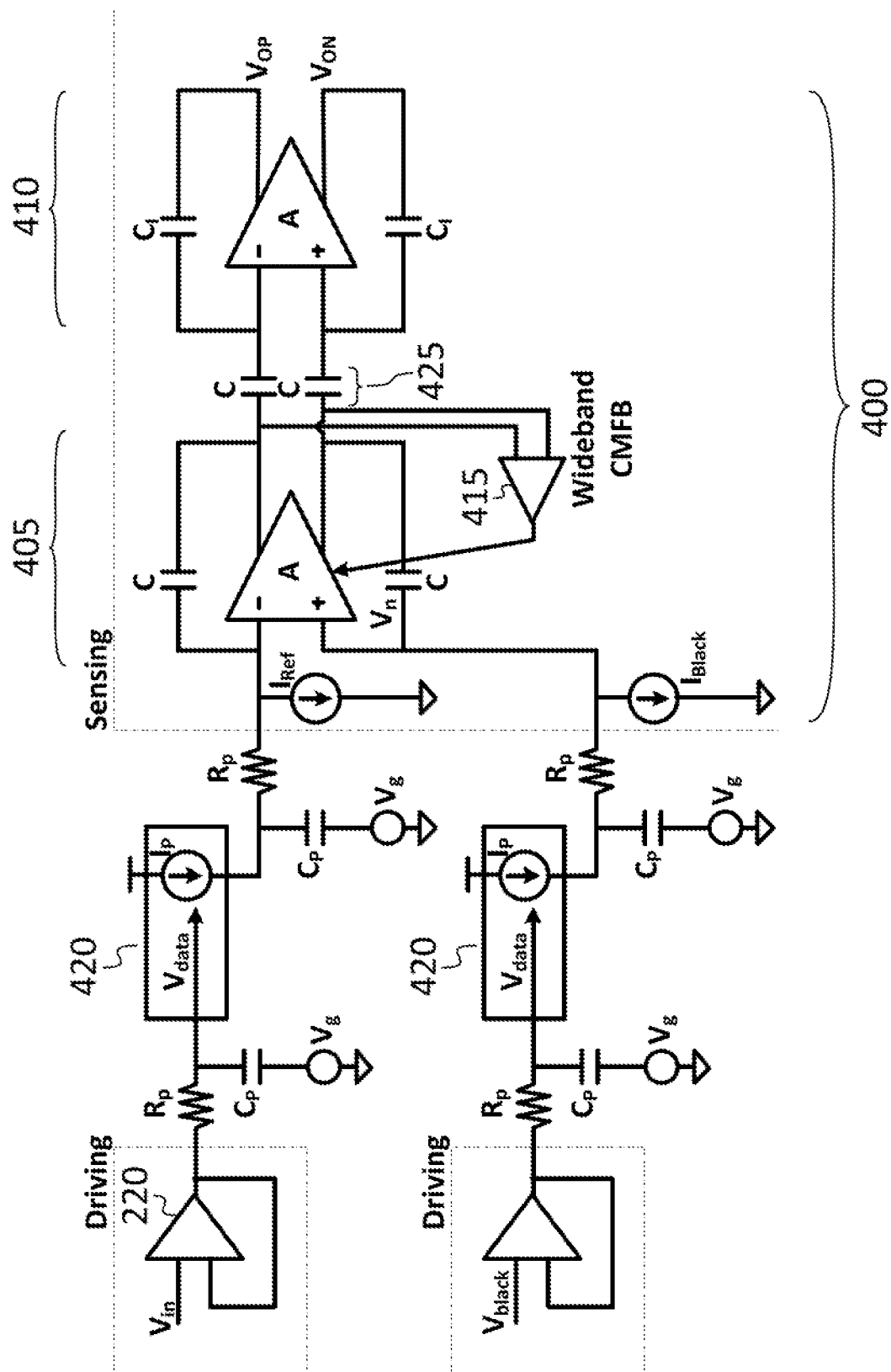
FIG. 3 is a schematic diagram, according to an embodiment of the present disclosure.

FIG. 3 shows a differential sensing circuit 400, with two inputs for sensing a difference between a current from a first pixel (e.g., the odd pixel of FIGS. 2A-2C) and a second pixel (e.g., the even pixel of FIGS. 2A-2C) (each current having subtracted from it a respective reference current). The differential sensing circuit has a two-stage architecture with a low-pass current filter 405 (or "differential low-pass filter") (e.g., a first integrator, as shown) as the first stage, and an integrator 410 (or "differential integrator") (e.g., a second integrator, as shown) as the second stage. The integrator 410 may be coupled to the low-pass current filter 405 by two mirroring capacitors 425. Each of the low-pass current filter 405 and the integrator 410 may include a fully differential operational amplifier with a capacitor (or "feedback capacitor" in each feedback path. As mentioned above, the circuit may be used to perform differential sensing between two adjacent pixels (e.g. a red pixel and a green pixel (of a composite pixel containing three pixels, a red pixel, a green pixel, and a blue pixel), or a green pixel and a blue pixel of a composite pixel). A wideband common mode feedback amplifier 415 (which may have an open loop bandwidth of between 10 MHz and 100 MHz) feeds back around the low-pass current filter 405.

For ease of illustration, the circuit of FIG. 3 shows both the drive amplifier 220 and the differential sensing circuit 400 simultaneously connected to the pixels 420 through respective resistor-capacitor networks used to model the column conductors 205. In some embodiments, however, there is only one column conductor 205 per pixel, and either the drive amplifier 220 or the differential sensing circuit 400 is connected to it at any time (as shown in FIGS. 2A-2C, in which multiplexers are used to select whether the drive amplifier 220 or the differential sensing circuit is connected to the column conductor 205 at any time).

In some embodiments, the low-pass current filter 405 and the differential integrator 410 may be fully differential. As used herein, a fully differential circuit is one that (unlike a single-ended or pseudo-differential amplifier) does not compare the signal to a fixed reference voltage. Instead, each differential gain stage in a fully differential amplifier, for example, compares the two signals being processed directly to each other.

The wideband common mode feedback amplifier 415 may compute the common mode output signal at the output of the low-pass current filter 405 (e.g., it may compute the average of the voltages at the two output conductors using a resistor network), and feed back to a common mode input in the low-pass current filter 405. The common mode input may be, for example, (i) a gate of a current source (or "tail current source") connected to the two sources of a differential pair in the low-pass current filter 405, or (ii) a node connected to two corresponding transistors in the load network of a differential pair in the low-pass current filter 405.

The output of the circuit of FIG. 3 may include contributions from several sources of noise, in addition to the contribution from the current to be sensed (the difference between (i) the current driven by the drive transistor 110 of the odd pixel and (ii) the reference current). For example, leakage current from all of the other pixels (which are turned off) connected to the column conductor 205 that is connected to the odd pixel may be significantly greater than the current driven by the drive transistor 110 of the odd pixel. This contribution may be canceled at least in part to the extent that a similar leakage current flows in the column conductor 205 that is connected to the even pixel. A small mismatch in the capacitance ($C_P$) to ground of the column conductors 205 may, however, result in a significant differential current, given approximately by $$I_{diff} \sim I_{Leakage} * \Delta C_P / C_P$$

This differential current may be indistinguishable from the current to be sensed; both are DC signals. Moreover, ground noise may translate to differential current in the presence of a mismatch in the capacitance ($C_P$) to ground of the column conductors 205. The presence of the wideband common mode feedback amplifier 415 may help to reduce this effect, but even at frequencies at which the gain of the wideband common mode feedback amplifier 415 is high, the differential current error may be approximately given by the following:

$$I_{diff} \sim V_g * \Delta C_P / C_P$$

The low frequency components of this ground noise may also be indistinguishable from the current to be sensed.

Figure 4:
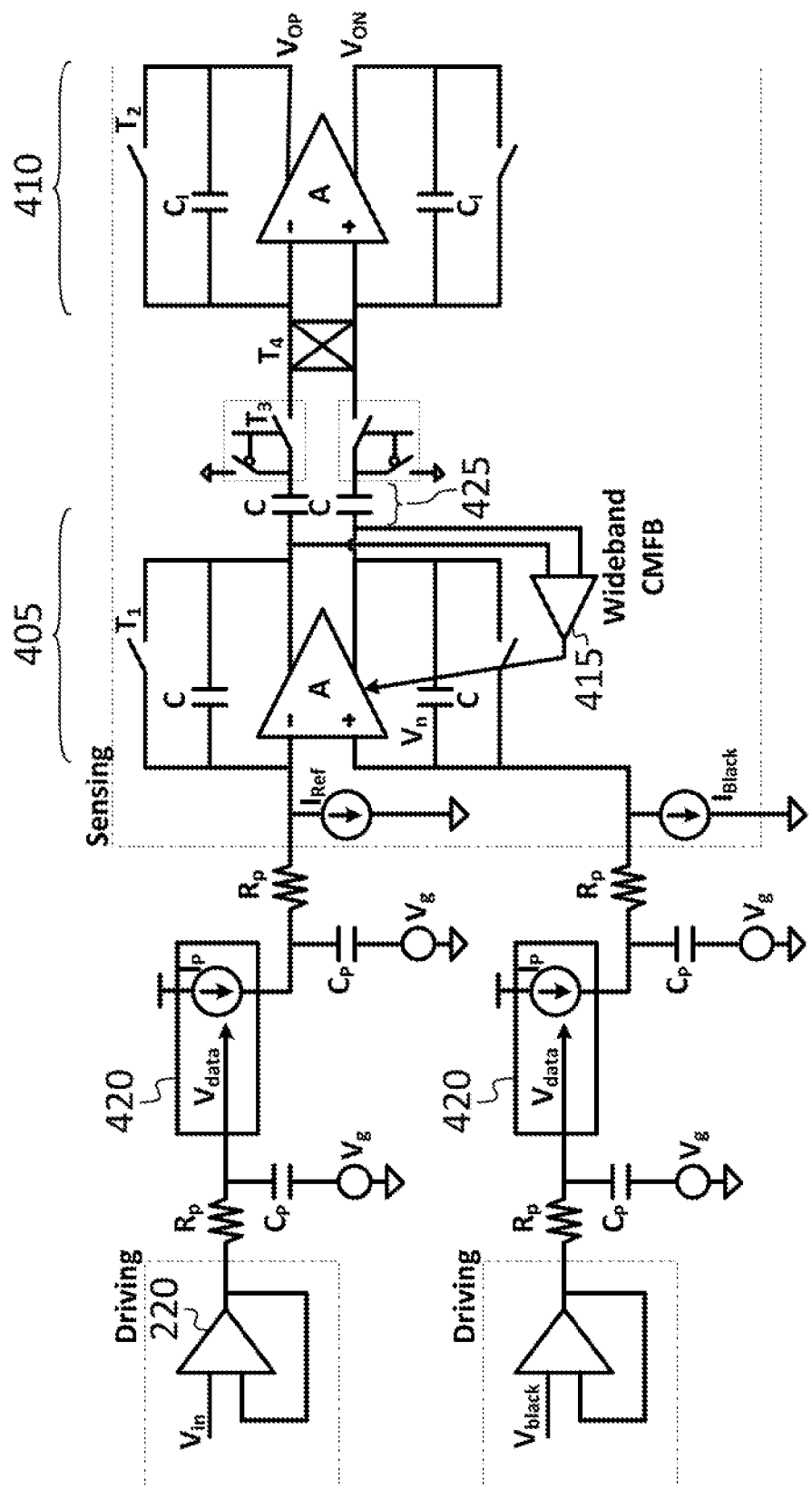
FIG. 4 is a schematic diagram, according to an embodiment of the present disclosure.

Referring to FIG. 4, in some embodiments, correlated double sampling is used to suppress these noise contributions, and other low frequency noise contributions that may be present. In some embodiments, the method includes a first phase, in which the signal (i.e., the current to be sensed) is turned off and the noise is accumulated (e.g., integrated), and a second phase, in which the signal is turned on and the combination of the signal and the noise is accumulated (e.g., integrated); the two integrated results may then be subtracted. In the case of pixel current sensing, the first phase may involve integrating the input current when the pixel is turned off (i.e., integrating the noise) and the second phase may involve integrating the input current when the pixel is turned on.

In part to this end, the embodiment of FIG. 4 includes several switches not shown in the circuit of FIG. 3. Each of the feedback capacitors of the differential low-pass filter 405 has a reset switch $T_1$ (e.g., a transistor switch) connected across it, and each of the feedback capacitors of the differential integrator 410 has a reset switch $T_2$ (each of which may also be a transistor switch) connected across it, so that each of the differential low-pass filter 405 and the differential integrator 410 may be reset by closing the corresponding switches (e.g., turning on the corresponding transistors). A polarity-reversing switch $T_4$ couples the mirroring capacitors 425 to the input of the differential integrator 410. The polarity-reversing switch may for example include a first pair of switches that, when turned on, connect (i) the upper one of the mirroring capacitors 425 to the upper input of the differential integrator 410 and (ii) the lower one of the mirroring capacitors 425 to the lower input of the differential integrator 410. The polarity-reversing switch may further include a second pair of switches that, when turned on, connect (i) the upper one of the mirroring capacitors 425 to the lower input of the differential integrator 410 and (ii) the lower one of the mirroring capacitors 425 to the upper input of the differential integrator 410. As such, when the first pair of switches is turned on and the second pair of switches is turned off, the polarity of the connection between the differential low-pass filter 405 and the differential integrator 410 is the opposite of the polarity of the connection between the differential low-pass filter 405 and the differential integrator 410 when the first pair of switches is turned off and the second pair of switches is turned on.

In operation, the differential low-pass filter 405 and the differential integrator 410 may be reset and then released from reset, and the differential integrator 410 may be allowed to integrate the differential current during a first interval of time (or "first integration interval") with the odd pixel turned off (e.g., as a result of the lower pass-gate transistor 130 in the odd pixel being turned off). The odd pixel may then be turned on (i.e., the lower pass-gate transistor 130 may be turned on, so that the current driven by the drive transistor 110 flows through the column conductor 205), the polarity of the polarity-reversing switch $T_4$ may be reversed, and the differential integrator 410 may be allowed to integrate the differential current during a second interval of time (or "second integration interval"), having the same duration as the first interval of time. At the end of the second interval of time, the output of the differential integrator 410 may be expected to include a contribution proportional to the current driven by the drive transistor 110 when the odd pixel is on; moreover, noise currents that are constant during the first and second intervals of time may be expected to be largely suppressed in the output of the differential integrator 410 at the end of the second interval of time, having been integrated with a first sign during the first interval of time, and with the opposite sign during the second interval of time. The polarity-reversing switch $T_4$ may be implemented between the differential low-pass filter 405 and the differential integrator 410, instead of at the input to the differential low-pass filter 405, to avoid connecting the polarity-reversing switch $T_4$ directly to the column conductors 205, which may have a significant capacitance.

Several issues may however degrade the performance of the system in this mode of operation. First, the differential low-pass filter 405 may determine the bandwidth and settling time of the system. As mentioned above, the differential low-pass filter 405 may be reset at the beginning of the operation. Further, the filter response may change while in reset. This may impact the extent to which noise integrated during the second interval of time cancels noise integrated during the first interval of time. A second issue may be that when signals are sent to turn on the pixel current ($I_{pixel}$) and the reference current (IREF), the effect of their having been turned on may occur, at the differential low-pass filter 405, at different times. For example, the signal that turns on the lower pass-gate transistor 130 may incur a delay in reaching the pixel (which may depend on the location of the pixel in the display) and the current from the pixel may incur a delay in reaching the differential low-pass filter 405 (which also may depend on the location of the pixel in the display). To the extent the sensing circuit integrates when one but not the other of the pixel current and the reference current is present at the differential low-pass filter 405, a sensing error may occur.

In some embodiments, these issues may be mitigated by (i) implementing a wait mode before beginning the first integration interval and (ii) implementing a hold mode before beginning the second integration interval. In the wait state, the differential low-pass filter 405 is released from reset and the differential integrator 410 remains in the reset state, while the output of the differential low-pass filter 405 reaches steady state. The length of the wait state may be chosen to be substantially larger than the fundamental time constant (as defined by the reciprocal of the dominant pole of the filter) of the low-pass filter 405. The length of the hold state may be chosen to be substantially larger than (i) any mismatch in timing between the signals turning on the pixel current vs signals turning on the reference generator current, and (ii) the RC time-constant of the column.

A pair of coupling switches $T_3$ coupled between the two mirroring capacitors and the polarity-reversing switch may be used to implement the hold mode. Each of the coupling switches is configured to either (i) in a first state, connect a respective mirroring capacitor of the two mirroring capacitors to a corresponding terminal of the polarity-reversing switch, or, (ii) in a second state, to disconnect the terminal of the respective mirroring capacitor from the corresponding terminal of the polarity-reversing switch and to connect the terminal of the respective mirroring capacitor to a supply node. As used herein, a "supply node" is any voltage reference, e.g., a power supply terminal, ground, or other node at which the voltage is controlled to be substantially constant. At the end of the first integration interval and at the beginning of the hold period, the coupling switches $T_3$ are set to disconnect the mirroring capacitors from the differential integrator 410, and the polarity-reversing switch $T_4$ is switched. In some embodiments, the $T_3$ and $T_4$ switches are physically combined. In such an embodiment, the single combined switch that incorporates the functions of $T_3$ and $T_4$ in FIG. 4 may have three modes of operation, (i) normally connect, (iii) reverse connect, and (iii) disconnect both.

The coupling switches $T_3$ are left disconnected for the duration of the hold period, which is selected to be sufficiently long that any transient fluctuations in the output of the differential low-pass filter 405 (e.g., fluctuations resulting from differences in the times at which the effects, of the pixel current and the reference current being turned on, occur, at the differential low-pass filter 405). As mentioned above, the length of the hold state may be chosen to be substantially larger than (i) any mismatch in timing between the signals turning on the pixel current vs signals turning on the reference generator current, and (ii) the RC time-constant of the column conductor 205. For example, the hold period may be selected to be sufficiently long that the transient effects of any mismatch between the pixel turning on and the reference generator turning on will have subsided before integration begins again, at the end of the hold period. These transient effects may include effects due to the mismatch in the arrival of the enable signals, and once current is enabled, the mismatch in the arrival time of the current to the sensing front end. The former may be related to enable signal propagation delay across the distributed display. The latter may be related to the resistance and capacitance of the column conductor 205, because pixel current is injected at the far end of the column conductor 205 and the reference is injected at the near end of the column conductor 205. At the end of the hold period, the coupling switches $T_3$ are set so that the mirroring capacitors 425 are reconnected to the differential integrator 410, and the second integration interval begins. At the end of the second integration interval, the output of the differential integrator 410 may be sampled. This sampled output value may be a measure of the pixel current (i.e., the current driven by the drive transistor 110 of the odd pixel); it may be used, for example, to adjust compensation coefficients used to compensate for differences between transistors in the display, or changes, over time, of their characteristics. Each of the wait period and the hold period may be longer than 1 microsecond, and may, for example, have a duration of between 5 and 30 microseconds.

Figure 5A:
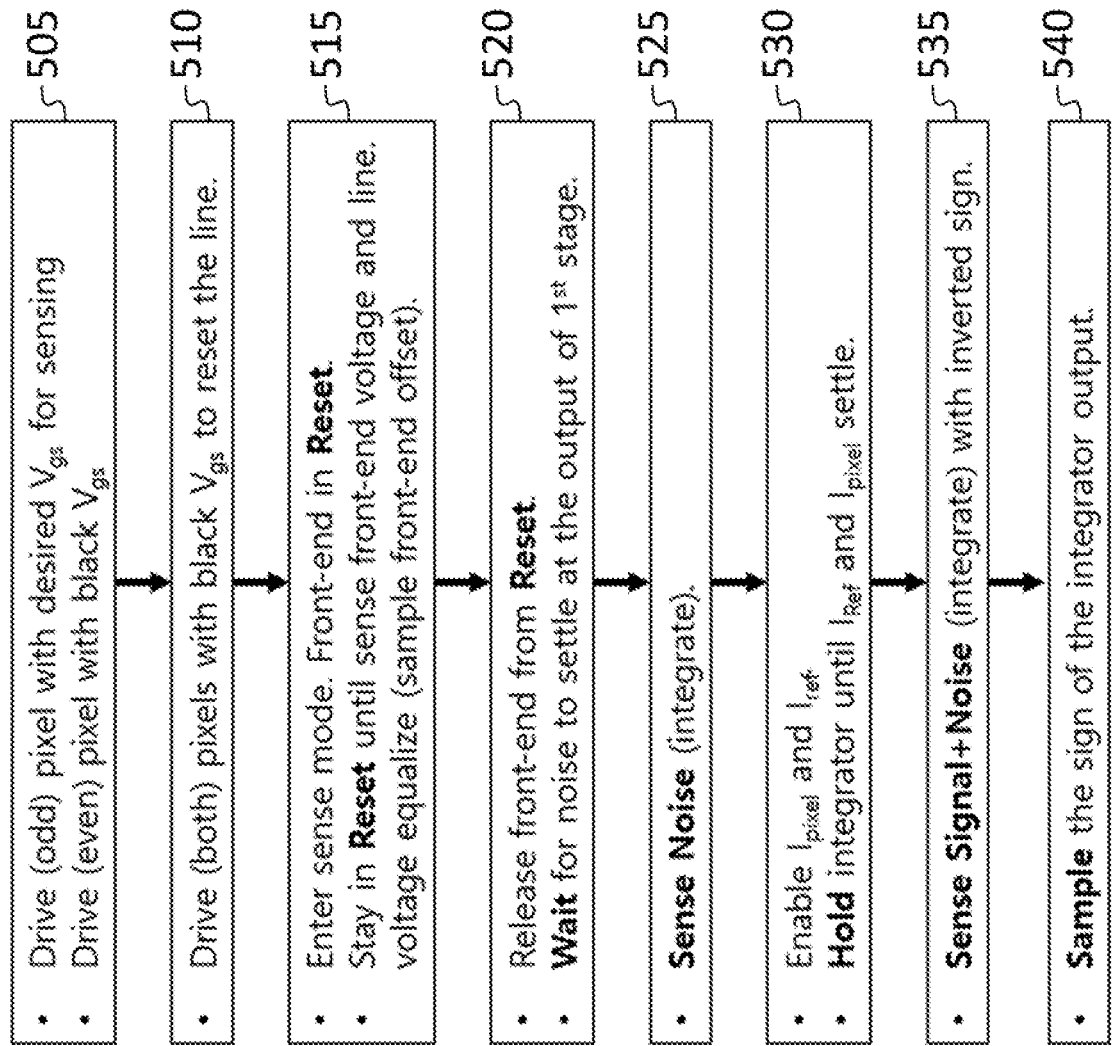
FIG. 5A is a flow chart, according to an embodiment of the present disclosure.
Figure 5B:
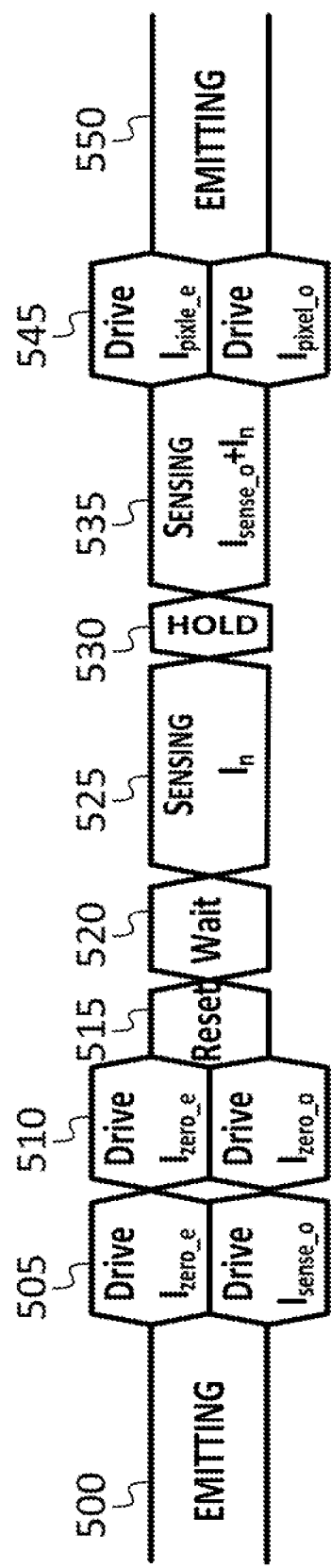
FIG. 5B is a timing diagram, according to an embodiment of the present disclosure.
Figure 5C:
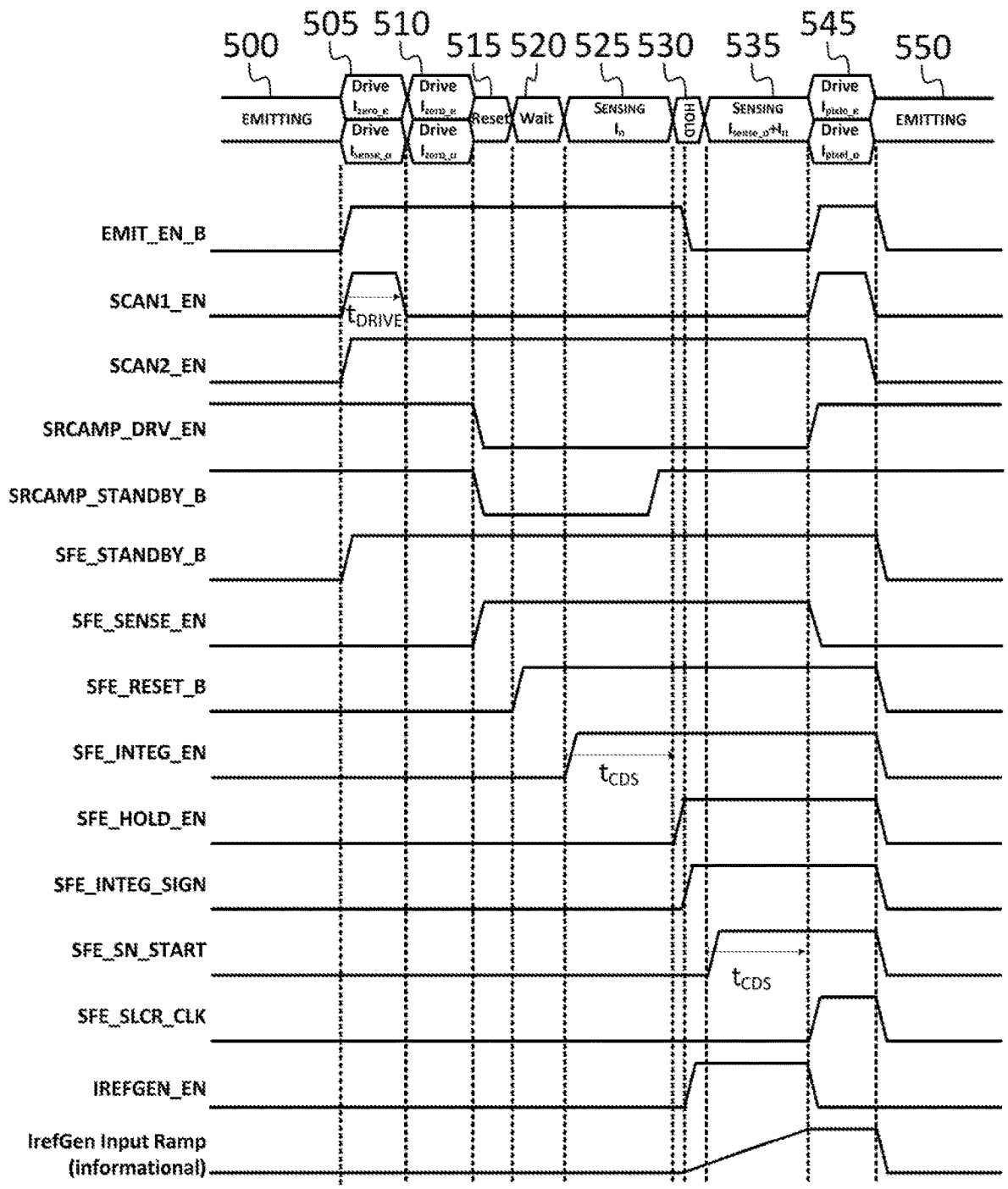
FIG. 5C is a timing diagram, according to an embodiment of the present disclosure.

FIG. 5A is a flow chart, for a method of some embodiments, FIG. 5B and FIG. 5C are timing diagrams corresponding to FIG. 5A, and FIG. 5D is a table showing switch settings for some of the modes of FIGS. 5A, 5B and 5C. FIG. 5C includes the timing diagram of FIG. 5B, and also shows the timing of control signals (e.g., SCAN1_EN and SCAN2_EN) in the system. At 505, the odd pixel is driven with the desired $V_{gs}$ for sensing, and the even pixel is driven with the $V_{gs}$ corresponding to black (i.e., for which the light emitting diode 120 will not emit light). Both of these drive operations may be performed with the upper pass-gate transistor 125 and the lower pass-gate transistor 130 turned on, so that the capacitor of each pixel is charged to the corresponding voltage. At 510, both the even and the odd pixel are driven with the $V_{gs}$ corresponding to black, to reset the column conductors 205. This second drive step, at 510, may be performed with the upper pass-gate transistor 125 turned off, so that the charge on the capacitor of each pixel is not affected.

At 515, the drive amplifiers 220 are disconnected from the column conductors 205, and the sensing circuit is connected to the column conductors 205. The differential low-pass filters 405 and the differential integrators 410 are kept in reset until the sense front-end voltage and the voltage on the column conductors 205 equalize. At 520, during the wait period, the differential low-pass filters 405 are released from reset and the differential integrators 410 remain in reset, allowing the noise at the outputs of the differential low-pass filters 405 to settle. At 525, during the first integration interval, the differential integrators 410 are released from reset, and the noise is integrated. At 530, the pixel currents are enabled (by turning on the lower pass-gate transistors 130), the reference currents are turned on, the polarity-reversing switch $T_4$ is switched to the opposite polarity, and the coupling switches $T_3$ are opened to disconnect the differential integrator 410 from the mirroring capacitors 425. The lower reference current, $I_{Black}$, may be selected such that the light emitting diode 120 is sufficiently reverse biased when the current driven by the drive transistor 110 is being sensed. This state is maintained during the hold period, until the pixel current and the reference currents settle, at the inputs of the differential low-pass filter 405.

At 535, the coupling switches $T_3$ are closed to reconnect the differential integrator 410 to the mirroring capacitors 425, and during the second integration interval, the current to be sensed (the difference between the current driven by the drive transistor 110 of the odd pixel and the reference current) is integrated, together with the noise current, which remains present. During the second integration interval the polarity of the noise current is switched, so that as it is integrated during the second integration interval, it tends to remove, from the capacitors of the differential integrator 410, the charge that accumulated there, as a result of the noise, during the first integration interval. At 540, the output of the differential integrator 410 is sampled, as a measure of the current driven by the drive transistor 110 of the odd pixel.

Both before the performing of the measurement of the current driven by the drive transistor 110 of the odd pixel, and after the completion of that measurement, the pixel may be used to display, e.g., images or video as shown at 500 and 550 in FIG. 5B. The drive step to program the pixel with a suitable voltage for such displaying after the completion of the measurement is shown at 545 in FIG. 5B. The table of FIG. 5D shows, as mentioned above, switch settings for some of the modes of FIGS. 5A and 5B. For cells annotated with a reference to note 1 (i.e., a superscript 1), it may be noted that since the differential integrator 410 is in reset ($T_2$ closed) in these modes, the switch states that are so annotated may be different, while nonetheless allowing the circuit to operate properly. For cells annotated with a reference to note 2 (i.e., a superscript 1), it may be noted that since the differential integrator 410 is disconnected from the differential low-pass filter 405 ($T_3$ open), the switch states that are so annotated may be different, while nonetheless allowing the circuit to operate properly.

Figure 6:
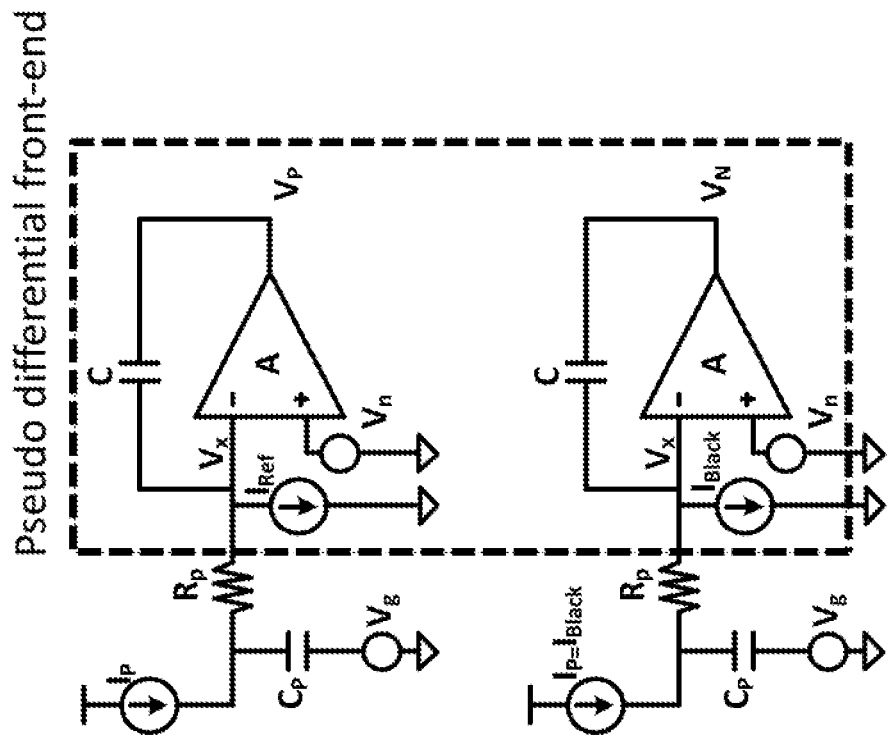
FIG. 6 is a schematic diagram, according to an embodiment of the present disclosure.

In some embodiments, the roles of the first integration interval and the second integration interval are reversed, i.e., the current to be sensed is integrated (along with the noise) during the first integration interval and the noise is integrated (with the opposite polarity) during the second integration interval. In this case, the pixel current and the reference current are both turned on after the reset mode, during the wait mode, and they are both turned off at the beginning of the hold period. The methods disclosed herein for sensing the drive current of an odd pixel, using an even pixel as a reference, may be performed for any pixel of the display, using another pixel as a reference. For example, the odd pixel mentioned herein may be used as a reference to measure the drive current of the even pixel. In some embodiments, the differential low-pass filter 405 or the differential integrator 410 is a pseudo-differential circuit (as shown, for example, in FIG. 6) instead of being a fully differential circuit.

As used herein, an "input" of a circuit includes one or more conductors and may include further inputs. For example, a differential input may include a first conductor identified as a noninverting input and a second conductor identified as an inverting input. Similarly, an "output" of a circuit, as used herein, includes one or more conductors and may include further outputs. For example, a differential output may include a first conductor identified as a noninverting output and a second conductor identified as an inverting output. As used herein, a "switch" may include a plurality of switches; for example, a single-pole, double-throw (SPDT) switch may be implemented as two single-pole, single-throw (SPST) switches (e.g., each SPST switch being a transistor) controlled such that at all times in operation one of the SPST switches is open and one of the SPST switches is closed. Similarly, a polarity-reversing switch may be constructed using four SPST switches (e.g., four transistors) as discussed in further detail above. As used herein, when a first component is described as being "selectively connected" to a second component, the first component is connected to the second component by a switch (e.g., a transistor switch), so that, depending on the state of the switch, the first component may be connected to the second component or disconnected from the second component.

In some embodiments, the control of various control signals and of circuits like the digital to analog converter may be performed by a processing circuit. The term "processing circuit" is used herein to mean any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general purpose hardware, such as a CPU, configured to execute instructions stored in a non-transitory storage medium. A processing circuit may be fabricated on a single printed circuit board (PCB) or distributed over several interconnected PCBs. A processing circuit may contain other processing circuits; for example a processing circuit may include two processing circuits, an FPGA and a CPU, interconnected on a PCB.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major portion", when applied to a plurality of items, means at least half of the items.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a correlated double sampling pixel sensing front end have been specifically described and illustrated herein, many modifications and variations will be apparent to those skilled in the art. Accordingly, it is to be understood that a correlated double sampling pixel sensing front end constructed according to principles of this disclosure may be embodied other than as specifically described herein. The invention is also defined in the following claims, and equivalents thereof.

What is claimed is:

1. A system for sensing a current of a pixel in a display, the system comprising:
    a differential low-pass filter having a differential input and a differential output, a first conductor of the differential input being configured to receive a difference between a pixel current and a reference current;
    a differential integrator having a differential input and a differential output;
    two mirroring capacitors coupling the differential output of the differential low-pass filter to the differential input of the differential integrator;
    a polarity-reversing switch coupled between the mirroring capacitors and the differential input of the differential integrator, the polarity-reversing switch being configured to selectively switch the polarity of the connection between the mirroring capacitors and the differential input of the differential integrator; and
    a pair of coupling switches coupled between the two mirroring capacitors and the polarity-reversing switch, each of the coupling switches being configured to selectively:
        disconnect a terminal of a respective mirroring capacitor of the two mirroring capacitors from a corresponding terminal of the polarity-reversing switch and
        connect the terminal of the respective mirroring capacitor to a supply node.

2. The system of claim 1, wherein the differential low-pass filter comprises:
    a differential amplifier;
    two feedback capacitors, each connected between a respective conductor of the differential output of the differential low-pass filter and a corresponding conductor of the differential input of the differential low-pass filter; and
    two reset switches, each connected across a respective feedback capacitor of the two feedback capacitors and configured to selectively discharge the respective feedback capacitor.

3. The system of claim 2, wherein the differential amplifier is a fully differential amplifier.

4. The system of claim 2, wherein the differential amplifier is a pseudo differential amplifier.

5. The system of claim 2, wherein the differential integrator comprises:
    a fully differential amplifier;
    two feedback capacitors, each connected between a respective conductor of the differential output of the differential integrator and a corresponding conductor of the differential input of the differential integrator; and
    two reset switches, each connected across a respective feedback capacitor of the two feedback capacitors and configured to selectively discharge the respective feedback capacitor.

6. The system of claim 5, further comprising:
    a display panel comprising a first pixel and a second pixel; and
    a control circuit,
    the control circuit being configured to:

set a stored voltage of the first pixel to a first value, the first value corresponding to an on state of the first pixel;
set a stored voltage of the second pixel to a second value, the first value corresponding to an off state of the second pixel;
close the reset switches of the differential low-pass filter;
close the reset switches of the differential integrator;
disable a current output of the first pixel;
open the reset switches of the differential low-pass filter;
open the reset switches of the differential integrator;
wait during a first integration interval;
cause the polarity-reversing switch to reverse the polarity of the connection between the mirroring capacitors and the differential input of the differential integrator; and
wait during a second integration interval.

7. The system of claim 6, wherein the control circuit is further configured to wait, after opening the reset switches of the differential low-pass filter and before opening the reset switches of the differential integrator, during an interval having a length exceeding a fundamental time constant of the differential low-pass filter.

8. The system of claim 7, wherein the control circuit is further configured to:
set the coupling switches to disconnect the two mirroring capacitors from the polarity-reversing switch at the end of the first integration interval;
wait during a maximum stabilization time; and
set the coupling switches to connect the two mirroring capacitors to the polarity-reversing switch at the beginning of the second integration interval,
the maximum stabilization time begin the larger of:
a time for the reference current to stabilize at the differential input of the differential low-pass filter, and
a time for the pixel current to stabilize at the differential input of the differential low-pass filter.

9. A method for operating a sensing circuit for sensing a pixel current of a pixel of a display panel, using correlated double sampling, the method comprising:
during a first interval of time, resetting a pixel sensing circuit;
during a third interval of time following the first interval of time, operating the pixel sensing circuit in an integration mode;
during a fourth interval of time following the third interval of time, operating the pixel sensing circuit in a hold mode; and
during a fifth interval of time following the fourth interval of time, operating the pixel sensing circuit in the integration mode,
the pixel sensing circuit being configured to sense the pixel current,
the pixel sensing circuit comprising a low-pass filter and an integrator connected to an output of the low-pass filter,
the method further comprising maintaining the polarity of the connection between the integrator and the output of the low-pass filter reversed during the fourth interval of time and during the fifth interval of time,
the resetting of the pixel sensing circuit comprising operating each of the low-pass filter and the integrator in a reset mode;
the operating in the integration mode comprising:
operating the low-pass filter in a normal mode and operating the integrator in the normal mode, and
the operating in the hold mode comprising:
operating the low-pass filter in the normal mode,
operating the integrator in the normal mode, and
disconnecting the integrator from the low-pass filter.

10. The method of claim 9, further comprising, during a second interval of time following the first interval of time and preceding the third interval of time, operating the pixel sensing circuit in a wait mode,
the operating in the wait mode comprising:
operating the low-pass filter in a normal mode and
operating the integrator in the reset mode until a noise current of the pixel reaches a steady state.

11. The method of claim 9, wherein the low-pass filter is a differential low-pass filter and the integrator is a differential integrator.

12. The method of claim 11, wherein the differential low-pass filter comprises:
a differential amplifier;
two feedback capacitors, each connected between a respective conductor of the differential output of the differential low-pass filter and a corresponding conductor of the differential input of the differential low-pass filter; and
two reset switches, each connected across a respective feedback capacitor of the two feedback capacitors and configured to selectively discharge the respective feedback capacitor.

13. The method of claim 12, wherein the differential amplifier is a fully differential amplifier.

14. The method of claim 12, wherein the differential amplifier is a pseudo differential amplifier.

15. The method of claim 11, wherein the differential integrator comprises:
a differential amplifier;
two feedback capacitors, each connected between a respective conductor of the differential output of the differential integrator and a corresponding conductor of the differential input of the differential integrator; and
two reset switches, each connected across a respective feedback capacitor of the two feedback capacitors and configured to selectively discharge the respective feedback capacitor.

16. The method of claim 15, wherein the differential amplifier is a fully differential amplifier.

17. The method of claim 15, wherein the differential amplifier is a pseudo differential amplifier.

18. A system for sensing a current of a pixel in a display, the system comprising:
a filter having a differential input and a differential output, a first conductor of the differential input being configured to receive a difference between a pixel current and a reference current;
a differential integrator having a differential input and a differential output;
two mirroring capacitors coupling the differential output of the filter to the differential input of the differential integrator;
a polarity-reversing switch coupled between the mirroring capacitors and the differential input of the differential integrator, the polarity-reversing switch being configured to selectively switch the polarity of the connection between the mirroring capacitors and the differential input of the differential integrator; and a pair of coupling switches coupled between the two mirroring capacitors and the polarity-reversing switch, each of the coupling switches being configured to selectively:
disconnect a terminal of a respective mirroring capacitor of the two mirroring capacitors from a corresponding terminal of the polarity-reversing switch and
connect the terminal of the respective mirroring capacitor to a supply node.

19. The system of claim 18, wherein the means for low-pass filtering comprises:
a differential amplifier;
two feedback capacitors, each connected between a respective conductor of the differential output of the filter and a corresponding conductor of the differential input of the filter; and
two reset switches, each connected across a respective feedback capacitor of the two feedback capacitors and configured to selectively discharge the respective feedback capacitor.

20. The system of claim 19, wherein the differential amplifier is a fully differential amplifier.

\* \* \* \* \*